United States Patent
Amatsuchi (10) Patent No.: US 9,702,919 B2
(45) Date of Patent: Jul. 11, 2017

(54) METHOD FOR MANUFACTURING DISPLAY PANEL

(71) Applicant: JOLED INC., Tokyo (JP)

(72) Inventor: Mario Amatsuchi, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/125,332

(22) PCT Filed: Dec. 24, 2014

(86) PCT No.: PCT/JP2014/006441
§ 371 (c)(1),
(2) Date: Sep. 12, 2016

(87) PCT Pub. No.: WO2015/136589
PCT Pub. Date: Sep. 17, 2015

(65) Prior Publication Data
US 2017/0098398 A1    Apr. 6, 2017

(30) Foreign Application Priority Data
Mar. 14, 2014   (JP) .................. 2014-052556

(51) Int. Cl.
*G01R 31/02* (2006.01)
*G01M 11/02* (2006.01)
(Continued)

(52) U.S. Cl.
CPC ....... *G01R 31/022* (2013.01); *G01M 11/0257* (2013.01); *G01M 11/0264* (2013.01);
(Continued)

(58) Field of Classification Search
CPC .. G09G 3/006; G09G 3/3233; G09G 2330/10; G09G 2320/0233; G09G 3/2003;
(Continued)

(56) References Cited

U.S. PATENT DOCUMENTS

| 5,432,461 A | 7/1995 | Henley |
| 9,378,678 B1 * | 6/2016 | Lee ................... G09G 3/2003 |

(Continued)

FOREIGN PATENT DOCUMENTS

| JP | 5-273590 | 10/1993 |
| JP | 2005-326163 | 11/2005 |

(Continued)

OTHER PUBLICATIONS

International Search Report (ISR) in International Pat. Appl. No. PCT/JP2014/006441, dated Mar. 31, 2015.

*Primary Examiner* — Mariceli Santiago
*Assistant Examiner* — Jose M Diaz
(74) *Attorney, Agent, or Firm* — Greenblum & Bernstein, P.L.C.

(57) ABSTRACT

A method for manufacturing a display panel including a display unit in which pixels, in rows and columns, include an organic EL element and a drive transistor, includes, performed on the display panel having a line defect which is a pixel column that emits light of luminance not reflecting display gray level signals: displaying, overlappingly, a lighted line, which is a pixel column inputted with uniform display gray level signals, and the line defect by displaying the lighted line on the display unit and scanning the display unit with the lighted line in the row direction; reducing a bright/dark part range in the line defect by uniformly changing the display gray level inputted to the pixel column in the lighted line overlapping with the line defect; and identifying a defective pixel, which is the line defect origin, from the position of the reduced bright/dark part range in the display unit.

7 Claims, 8 Drawing Sheets

Line defect pattern A

Line defect pattern B (51) Int. Cl.
*G01R 31/26* (2014.01)
*G09G 3/20* (2006.01)

(52) U.S. Cl.
CPC ............ *G01R 31/02* (2013.01); *G01R 31/26* (2013.01); *G01R 31/2635* (2013.01); *G01R 31/2639* (2013.01); *G09G 3/2003* (2013.01)

(58) Field of Classification Search
CPC ........... H01L 27/3276; H01L 2251/568; G02F 1/136259; G02F 1/1309; G02F 2001/136263; G02F 1/1303; G02F 1/1306; H05K 3/225; H05K 3/222; H05K 3/288; H05K 3/4685; H05K 1/0292; H01R 43/00; H01R 43/02; H01R 43/0221; H01R 43/0228; H01R 43/0256; G01M 11/0257; G01M 11/0264; G01R 31/02; G01R 31/022; G01R 31/26; G01R 31/2635; G01R 31/2639

See application file for complete search history.

(56) References Cited

U.S. PATENT DOCUMENTS

| | | | |
|---|---|---|---|
| 2007/0030284 A1* | 2/2007 | Ogasawara | G09G 3/2003 345/589 |
| 2009/0061720 A1* | 3/2009 | Fujimaki | H01L 51/56 445/2 |
| 2013/0320323 A1* | 12/2013 | Segawa | H01L 51/0023 257/40 |
| 2016/0336383 A1* | 11/2016 | Hiraoka | H01L 27/3248 |
| 2017/0047540 A1* | 2/2017 | Kang | H01L 51/52 |

FOREIGN PATENT DOCUMENTS

| | | |
|---|---|---|
| JP | 2008-122810 | 5/2008 |
| JP | 2008-203636 | 9/2008 |
| JP | 2009-069520 | 4/2009 |

* cited by examiner

Line defect pattern A

FIG. 3B

Line defect pattern B

METHOD FOR MANUFACTURING DISPLAY PANEL

TECHNICAL FIELD

The present disclosure relates to a method for manufacturing a display panel.

BACKGROUND ART

In an active-matrix organic electroluminescence (EL) display, a thin-film transistor (TFT) is provided at each crosspoint between scanning lines and data lines, and a capacitor element and the gate of a drive transistor are connected to the TFT. In addition, the TFT is turned ON through a selected scanning line so as to input a data signal from a data line to the drive transistor and the capacitor element, and the light-emission timing of an organic EL element is controlled by the drive transistor and the capacitor element. Here, the more complex the configuration of a pixel circuit including the TFT, capacitor element, drive transistor, and organic EL element becomes, or the more the number of light-emitting pixels increases, the more electrical problems such as short-circuiting or open-circuiting of circuit elements or wires occur in the manufacturing stage which requires microfabrication.

In response to this, a method for correcting a defective pixel after the forming of the circuit element and wires has been proposed. In Patent Literature 1, a non-overlapping portion, which is connected to all pixels and separated from other conductive parts and wires, is provided for correcting a defective pixel that has become a bright spot that is always emitting light due to a short circuit, etc., in the circuit element. By irradiating the non-overlapping portion of the defective pixel with a laser, the non-overlapping portion is cut-off. With this, transmission of electric signals to the defective pixel is blocked and, in addition, the defective pixel becomes a dark spot without being damaged by the laser irradiation.

CITATION LIST

Patent Literature

[PTL 1] Japanese Unexamined Patent Application Publication No. 2008-203636

SUMMARY OF INVENTION

Technical Problem

In the pixel correction method disclosed in Patent Literature 1, it is necessary to identify a bright spot pixel in a black display or a dark spot pixel in a white display as a preliminary step to laser irradiation and repairing of the defective pixel.

However, depending on the defect mode, there are instances where a line (pixel row or pixel column) defect is observed instead of a spot (pixel) defect. In this case, it is further necessary to precisely observe the pixels included in the line defect one by one to identify the defective pixel to be repaired. As such, there is the problem that the process of identifying the defective pixel becomes complicated and lengthy.

In view of this, the present disclosure provides a method for manufacturing a display panel in which a defective pixel inspection process is simplified and shortened.

Solution to Problem

In order to solve the aforementioned problem, a method of manufacturing a display panel according to an aspect of the present disclosure is a method for manufacturing a display panel including a display unit in which a plurality of pixels, which emit light at a luminance reflecting display gray level signals that are inputted, are arranged in rows and columns, each of the plurality of pixels including a light-emitting element and a drive element that drives the light-emitting element, the method including the following, performed on the display panel having a line defect which is at least one of a pixel row and a pixel column that emits light at a luminance not reflecting the display gray level signals: displaying a lighted line and the line defect overlapping each other by displaying the lighted line on the display unit and scanning the display unit with the lighted line in one of a row direction and a column direction, the lighted line being one of a pixel row and a pixel column that emits light when uniform display gray level signals are inputted; reducing one of a bright part range and a dark part range in the line defect by uniformly changing, for all of the plurality of pixels included in the lighted line, one of (i) the uniform display gray level signals to be inputted to the lighted line displayed overlapping with the line defect and (ii) a drive power supply voltage that drives the drive element; and identifying a defective pixel which is an origin of the line defect, from a position, in the display unit, of the one of the bright part range and the dark part range that has been reduced.

Advantageous Effects of Invention

According to the present disclosure, it is possible to simplify and shorten an inspection process of a display panel having a line defect.

DESCRIPTION OF EMBODIMENT

Hereinafter, an embodiment of a method for manufacturing a display panel will be described using the drawings. It should be noted that the subsequently-described embodiment shows a specific preferred example of the present disclosure. Therefore, numerical values, shapes, materials, structural components, the arrangement and connection of the structural components, steps, the sequence of the steps, etc., shown in the following embodiment are mere examples, and are not intended to limit the scope of the present invention. Therefore, among the structural components in the subsequent embodiment, components not recited in any one of the independent claims which indicate the broadest concepts of the present invention are described as arbitrary structural components.

It should be noted that the respective figures are schematic diagrams and are not necessarily precise illustrations. Furthermore, in the respective figures, the same reference sign is given to substantially identical components, and overlapping description is omitted or simplified.

[Embodiment]

(1. Display Panel Configuration)

First, the configuration of a display panel 1 according to this embodiment shall be described.

Figure 1:
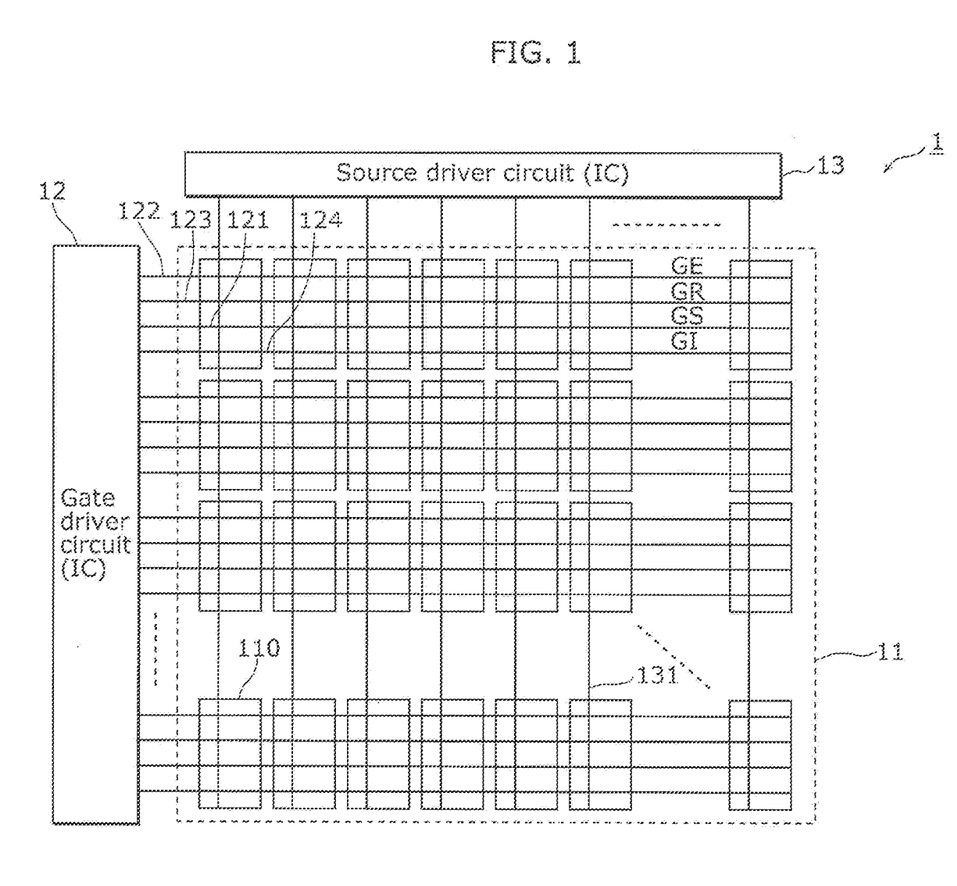
FIG. 1 is a schematic diagram illustrating a configuration of a display panel according to an embodiment.

FIG. 1 is a schematic diagram illustrating the configuration of a display panel according to the embodiment. As illustrated in FIG. 1, the display panel 1 according to this embodiment includes a display unit 11, gate signal lines 121 to 124, source signal lines 131, a gate driver circuit 12, and a source driver circuit 13.

The display unit 11 includes pixels 110 arranged in rows and columns, and displays images based on a video signal inputted from the outside.

The gate signal lines 121 to 124 are scanning lines disposed for each pixel row of the display unit 11, and transmit control signals for switching between conduction and non-conduction of switches included in the pixels 110. The gate signal lines 121 to 124 are connected to the gate driver circuit 12, and to the pixels 110 belonging to each of the pixel rows.

The source signal lines 131 are data lines disposed for each pixel column of the display unit 11, and transmit to the pixels 110 data voltages which are display gray level signals reflecting a video signal inputted from the outside.

The gate driver circuit 12 is a peripheral circuit of the display unit 11, and outputs the aforementioned control signals to the gate signal lines 121 to 124. The gate driver circuit 12 has a function of controlling the timing for writing data voltage into the pixels 110, a function of controlling the timing for applying various voltages such as an initialization voltage and a reference voltage to the pixels 110, etc.

The source driver circuit 13 is a peripheral circuit of the display unit 11, and outputs the data voltages to the source signal lines 131.

Next, the pixel circuit configuration of display unit 11 will be described.

Figure 2:
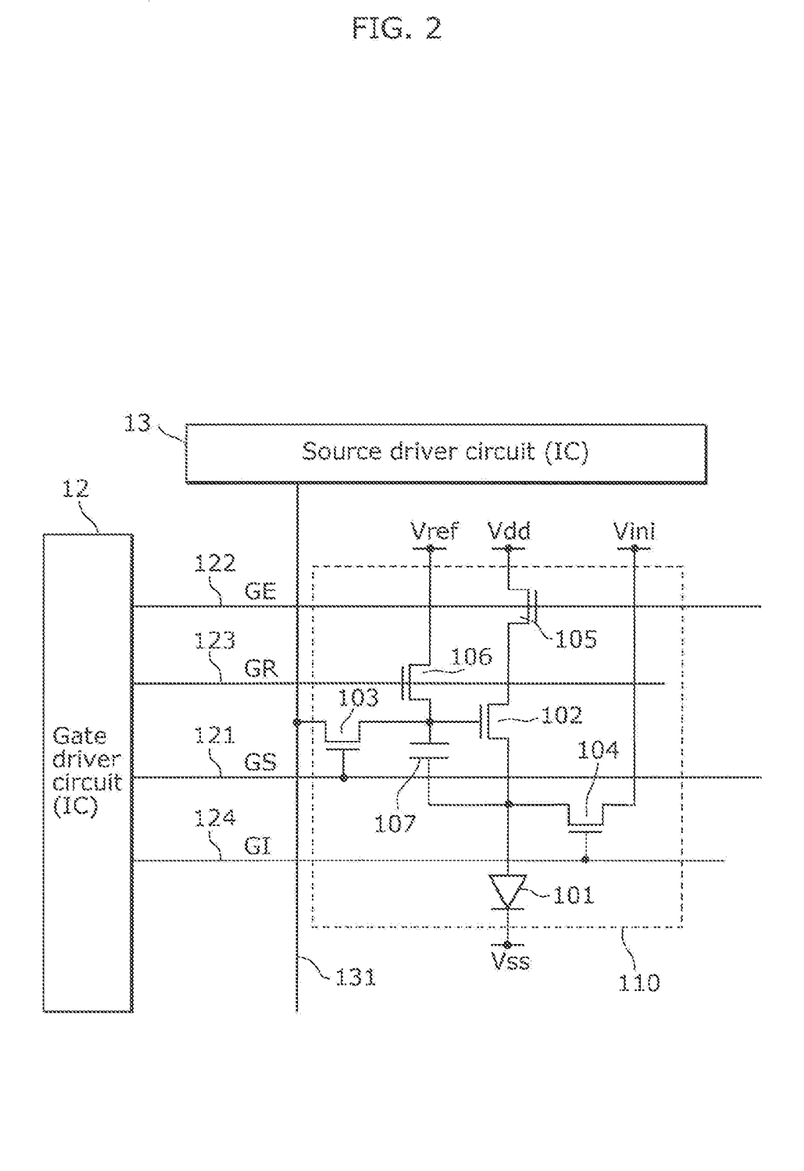
FIG. 2 is a circuit configuration diagram illustrating an example of a pixel circuit according to the embodiment.

FIG. 2 is a circuit configuration diagram illustrating an example of a pixel circuit according to the embodiment. The figure illustrates the circuit configuration of one pixel 110 among the pixels 110 included in the display unit 11, and the connection configuration between the pixel 110 and the peripheral circuits. As illustrated in the figure, the pixel 110 includes an organic EL element 101, a drive transistor 102, switches 103 to 106, and a capacitor element 107.

Organic EL element 101 is an example of a light-emitting element, and emits light according to the drive current of the drive transistor 102. Organic EL element 101 has a cathode to which an EL cathode voltage Vss is applied, and an anode to which the source of the drive transistor 102 is connected.

The drive transistor 102 is a voltage-driven drive element which controls the supply of current to the organic EL element 101. The drive transistor 102 has a gate connected to the first electrode of the capacitor element 107, and a source connected to the second electrode of the capacitor element 107 and the anode of the organic EL element 101. When switch 105 is ON, the drive transistor 102 causes the organic EL element 101 to emit light, by passing a drive current, which is a current that is in accordance with data voltage corresponding to the display gray level, to the organic EL element 101. Furthermore, the threshold voltage of the drive transistor 102 is detected at the capacitor element 107 while the switch 106 is ON, the switch 103 is OFF, the switch 104 is OFF, and switch 105 is ON.

The capacitor element 107 holds voltage that determines the amount of current to be passed to the drive transistor 102. The capacitor element 107 has a first electrode connected to the gate of drive transistor 102, and to which a reference voltage Vref is applied via the switch 106. The capacitor element 107, for example, maintains the applied reference voltage Vref even after the switch 106 is turned OFF, and continues to supply the reference voltage Vref to the gate of the drive transistor 102. Furthermore, data voltage is applied to the capacitor element 107 when the switch 103 is turned ON, and, after the switch 106 is turned OFF, the capacitor element 107 holds the data voltage. Then, drive current is supplied to the drive transistor 102 after the switch 105 is turned OFF.

The switch 103 is a switching NMOS transistor having a gate electrically connected to the gate signal line 121, a source electrically connected to the gate of the drive transistor 102, and a drain electrically connected to the source signal line 131. With the above-described connection configuration, the switch 103 switches between conduction and non-conduction between the source signal line 131 for supplying data voltage and the first electrode of the capacitor element 107.

The switch 106 is a switching NMOS transistor having a gate electrically connected to the gate signal line 123, a source electrically connected to the gate of the drive transistor 102, and a drain to which the reference voltage Vref is applied. The switch 106 switches between application and non-application of the reference voltage Vref to the first electrode of the capacitor element 107.

The switch 104 is a switching NMOS transistor having a gate electrically connected to the gate signal line 124, a source electrically connected to the source of the drive transistor 102, and a drain to which an initialization voltage Vini is applied. The switch 104 switches between application and non-application of the initialization voltage Vini to the second electrode of the capacitor element 107.

The switch 105 is a switching NMOS transistor having a gate electrically connected to the gate signal line 122, a source electrically connected to the drain of the drive transistor 102, and a drain to which an EL anode power supply voltage Vdd is applied. It should be noted that the EL anode power supply voltage Vdd is a drive power supply voltage for driving the drive transistor 102. With the above-described connection configuration, the switch 105 switches between application and non-application of the EL anode power supply voltage Vdd to the drain of the drive transistor 102. The switch 105 has a function of applying a potential Vdd to the drain of the drive transistor 102, and a function of causing the detection of the threshold voltage Vth of the drive transistor 102.

It should be noted that switches 103 to 106 are described as n-type TFTs, but may be p-type TFTs, or a mix of n-type TFTs and p-type TFTs may be used.

(2. Mechanism for Occurrence of Line Defect)

Here, the mechanism for the occurrence of what is called a line defect appearing in an image on the display panel 1 will be described.

Figure 3A:
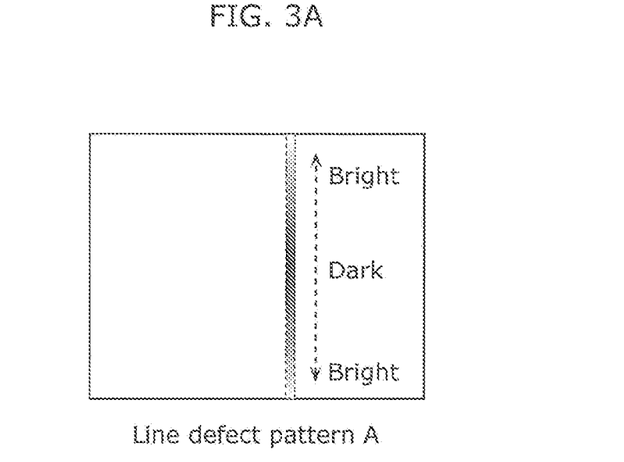
FIG. 3A is a diagram illustrating an image of a display unit when a line defect pattern A appears.
Figure 3B:
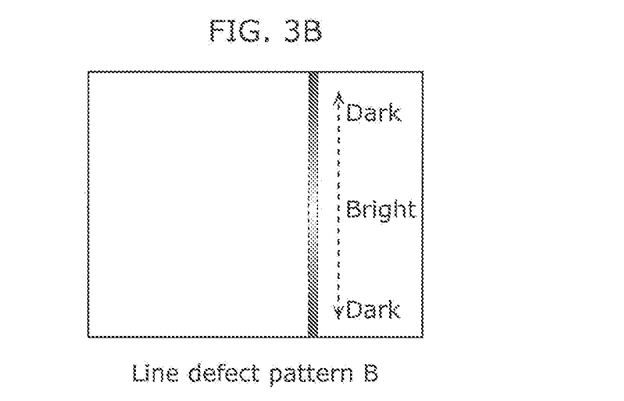
FIG. 3B is a diagram illustrating an image of a display unit when a line defect pattern B appears.

FIG. 3A is a diagram illustrating an image of a display unit when a line defect pattern A appears, and FIG. 3B is a diagram illustrating an image of a display unit when a line defect pattern B appears.

The images illustrated in FIG. 3A and FIG. 3B are images in the case where data voltage for a uniform display gray level is applied from the source driver circuit 13 to all the pixels 110 of display unit 11, but a line defect in the form of a vertical stripe is visible. This vertical stripe line defect consists of a certain pixel column that emits light at a luminance that does not reflect the data voltage for the inputted display gray level signals. More specifically, in the image in FIG. 3A, luminance gradually changes from bright to dark, from the top and bottom edges of display unit 11 toward the center. On the other hand, in the image in FIG. 3B, luminance gradually changes from dark to bright, from the top and bottom edges of display unit 11 toward the center.

For example, a short-circuit defect in a switch included in a pixel circuit can be given as a cause for obtaining the images in FIG. 3A and FIG. 3B. For example, in the pixel circuit illustrated in FIG. 2, a cause could be a short-circuit between the drain and the gate of the switch 103 of one of the pixels 110 included in the display unit 11. Normally, a different voltage values is set to the control voltage GS applied from the gate driver circuit 12 to the gate of the switch 103 via the gate signal line 121, and the data voltage Vdata applied from the source driver circuit 13 to the drain of the switch 103 via a data line. However, when there is a short-circuit between the drain and gate of the switch 103 in a certain pixel 110, the voltage of the source signal line 131 is affected by the voltage of the control signal voltage GS of the gate signal line 121 and changes from the voltage value of the data voltage Vdata outputted from the source driver circuit 13. The source signal line 131 affected by the potential change is disposed to the pixel column including the aforementioned pixel 110 having the short-circuit between the drain and gate of the switch 103 (hereafter referred to as defective pixel). Therefore, the pixels 110 belonging to the aforementioned pixel column receive, from the source signal line 131 affected by the potential change, a supply of data voltages that do not reflect the inputted display gray level signals. Here, since the source signal lines 131 have a predetermined wire resistance, in the source signal line 131 affected by the potential change, the closer to the defective pixel, the more intense the potential change becomes. As such, a pixel that belongs to the same pixel column as the defective pixel and is closer to the defective pixel emits light at a luminance closer to the light-emission luminance of the defective pixel, and a pixel that belongs to the same pixel column as the defective pixel and is farther from the defective pixel emits light at a luminance that is more different from the light-emission luminance of the defective pixel.

For example, when the data voltage is set to a positive voltage value—where the higher the voltage value, the higher (brighter) the gray level displayed, and the control voltage GS is set to a voltage value of 0 V or lower, the potential of a source signal line 131 in the vicinity of the defective pixel changes in the decreasing direction. In this case, a pixel 110 that belongs to the same pixel row as and is close to the defective pixel emits light at a luminance that is lower than the normally displayed luminance, and thus line defect pattern A appears. On the other hand, when the data voltage is set to a positive voltage value—where the lower the voltage value, the higher (brighter) the gray level displayed, and the control voltage GS is set to a voltage value of 0 V or lower, the potential of a source signal line 131 in the vicinity of the defective pixel changes in the decreasing direction. In this case, a pixel 110 that belongs to the same pixel row as and is close to the defective pixel emits light at a luminance that is higher than the normally displayed luminance, and thus line defect pattern B appears.

It should be noted that the line defects described above includes not only vertical stripe line defects caused by potential change in the source signal line 131, but also horizontal stripe line defects occurring due to short-circuiting between the gate and drain or the gate and source of switches 104 to 106, etc. However, since high-speed supply of data voltage to the pixels 110 is demanded of the source signal lines 131, the source signal lines 131 are set to have low impedance compared to gate signal lines 121 to 124. As such, the source signal lines 131 are more easily affected by potential change than the gate signal lines 121 to 124, and thus vertical stripe line defects appear more prominently than vertical stripe line defects.

As described above, since short-circuiting, etc., in a switching transistor included in the pixel circuit causes a line defect to appear on a displayed image, it is difficult to identify the defective pixel from the displayed image.

In contrast, the method for manufacturing a display panel according to this embodiment enables identification of the defective pixel, as described below.

(3. Display Panel Manufacturing Method)

Figure 4:
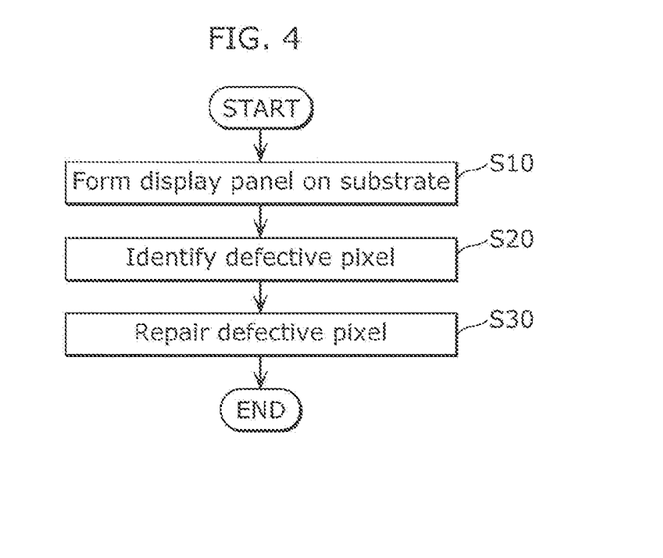
FIG. 4 is an operation flowchart illustrating a method for manufacturing a display panel according to the embodiment.

FIG. 4 is an operation flowchart illustrating the method for manufacturing a display panel according to this embodiment. The method for manufacturing a display panel according to the present disclosure includes a display panel forming process, a defective pixel identifying process, and a defective pixel repairing process.

(3-1. Display Panel Forming Process)

First, a display panel is formed on a display panel substrate (S10). Specifically, for example, a drive circuit layer in which the drive transistor 102, the switches 103 to 106, the capacitor element 107, the gate signal lines 121 to 124, and the source signal lines 131 illustrated in FIG. 2 are arranged as appropriate, is formed. Next, a light-emitting layer including the organic EL element 101 is formed above the drive circuit layer, after a planarizing process is performed on the drive circuit layer. The light-emitting layer includes, for example, an anode, a hole injection layer, a hole transport layer, an organic light-emitting layer, a bank layer, an electron injection layer, and a transparent cathode.

Next, a defective pixel is identified (S20). Hereinafter, step S20 which is the main part of the method for manufacturing a display panel according to the present disclosure will be described in detail. Hereinafter, the defective pixel identifying process for the vertical stripe line defect pattern A which changes from bright to dark to bright from the top edge toward the bottom edge of display unit 11, and the vertical stripe line defect pattern B which changes from dark to bright to dark from the top edge toward the bottom edge of display unit 11, are described in sequence.

(3-2-1. Defective Pixel Identifying Process in the Case where a Lighted Line Changes Bright-dark-bright)

Figure 5A:
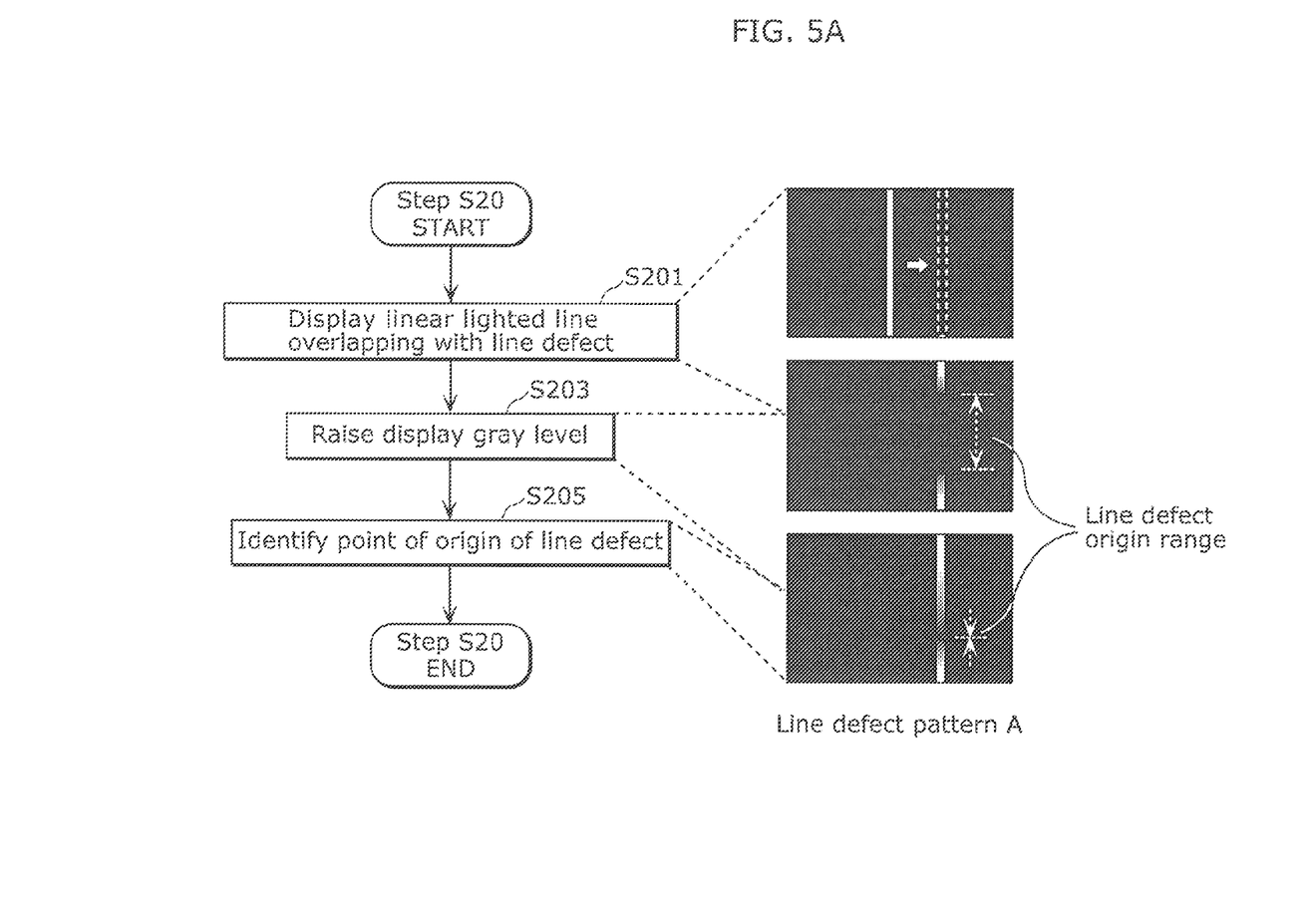
FIG. 5A is an operation flowchart for describing a defective pixel identifying process according to the embodiment in the case where a line defect pattern A appears.

FIG. 5A is an operation flowchart for describing the defective pixel identifying process according to this embodiment in the case where a line defect pattern A appears.

After the display panel forming process, a linear lighted line is displayed overlapping with the line defect in the image in which the line defect pattern A appears (S201). Specifically, a lighted line, which is a pixel column to which uniform display gray level signals are inputted from the source driver circuit 13, is displayed on the display unit 11. Next, the lighted line and the line defect are displayed in an overlapping manner by scanning the display unit 11 with the lighted line in the row direction (column scanning direction, display left-right direction). Here, it is preferable that pixels not belonging to the lighted line be caused to uniformly stop emitting light. With this, the contrast between the lighted line and the rest of the pixels improves, and the visibility of the lighted line can be enhanced.

In step S201, as a specific method for causing the display of the lighted line, the gate driver circuit 12 is caused to row-by-row sequentially supply HIGH level control voltages GS, GE, GR, and GI to the gate signal lines 121 to 124. Furthermore, the source driver circuit 13 is caused to supply, to only the source signal line 131 disposed to a certain pixel column, data voltages which are display gray level signals that cause the pixel column to uniformly emit light. Next, the source driver circuit 13 is caused to perform scanning by shifting the source signal line 131 that supplies the data voltage, sequentially on a column-by-column basis. The observer (operator) stops the column scanning of the lighted line at the point when the column-by-column sequentially shifting lighted line overlaps with the pixel column having the line defect observed in advance.

Next, the display gray level of the lighted line is raised (S203). Next, as a specific method for raising the display gray level of the lighted line, the source driver circuit 13 is caused to change the data voltage being applied to the source signal line 131 disposed to the pixel column to which the defective pixel belongs and with which the lighted line overlaps, so that the display gray level of the lighted line rises. With this, the light-emission luminance of the organic EL elements 101 of the pixel column to which the defective pixel belongs rises, and thus the dark part range of the line defect can be reduced.

It should be noted that, in step S203, as a method for raising the display gray level of the lighted line that overlaps with the line defect, the EL anode power supply voltage Vdd may be increased instead of changing the data voltage. With this, the light-emission current flowing through the pixel column to which the defective pixel belongs becomes larger and the light-emission luminance of the organic EL elements 101 rises, and thus the dark part range of the line defect can be reduced.

Next, the point of origin of the line defect is identified (S205). Specifically, the defective pixel which is the origin of the line defect is identified from the position, in the display unit 11, of the dark part range that was reduced in step S203.

According to the above-described line defect occurrence mechanism, in step S203, it can be determined that the defective pixel is included in an area that remains as a dark part despite uniformly raising the display gray level of the line defect in the pixel column of the line defect.

Accordingly, after observing the line defect, it is possible to narrow down the dark part range and identify the defective pixel by uniformly raising the display gray level of the lighted line, without having to observe the pixels included in the line defect in detail one by one. Therefore, the defective pixel identifying process can be simplified and shortened.

(3-2-2. Defective Pixel Identifying Process in the Case where a Lighted Line Changes Dark-bright-dark)

Figure 5B:
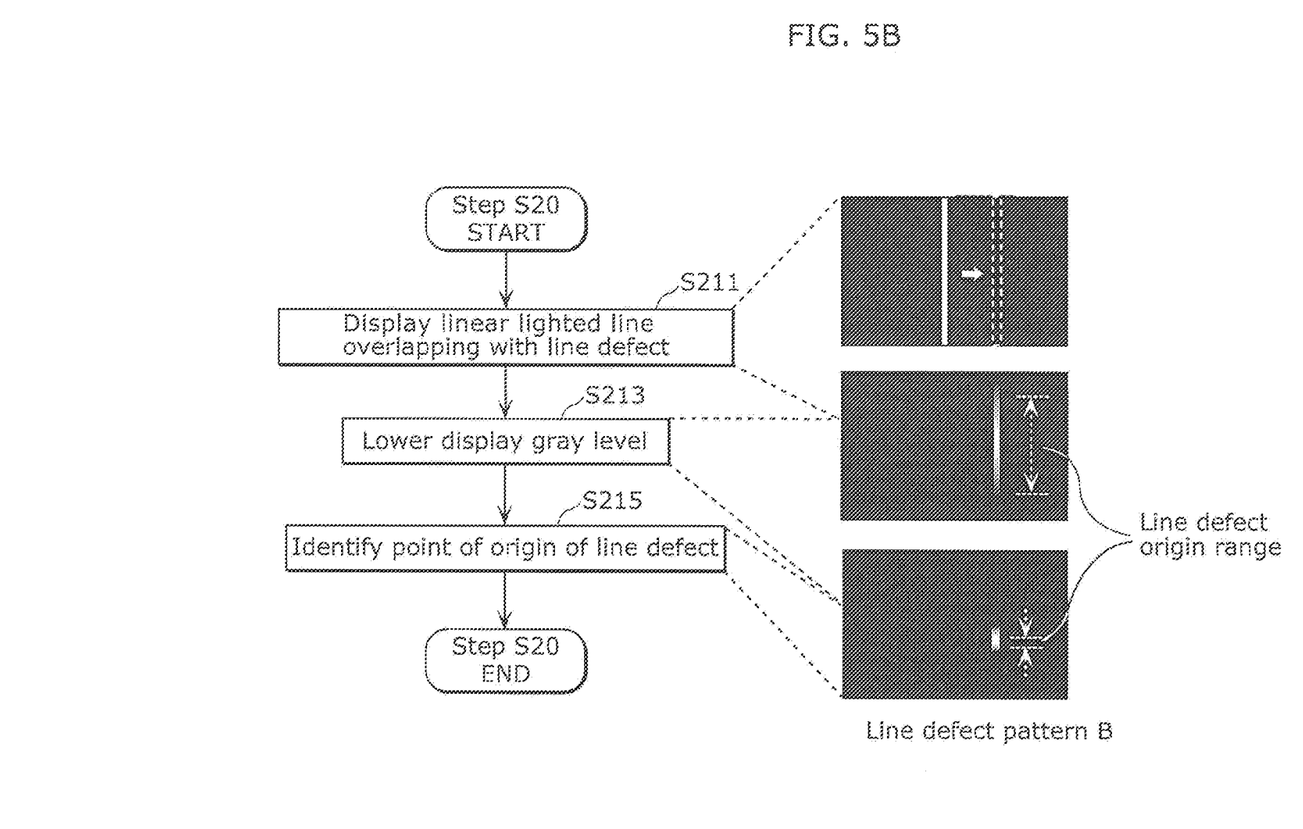
FIG. 5B is an operation flowchart for describing a defective pixel identifying process according to the embodiment in the case where a line defect pattern B appears.

FIG. 5B is an operation flowchart for describing the defective pixel identifying process according to this embodiment in the case where a line defect pattern B appears.

After the display panel forming process, a linear lighted line is displayed overlapping with the line defect in the image in which the line defect pattern B appears (S211). Specifically, a lighted line, which is a pixel column to which uniform display gray level signals are inputted from the source driver circuit 13, is displayed on the display unit 11. Next, the lighted line and the line defect are displayed in an overlapping manner by scanning the display unit 11 with the lighted line in the row direction (column scanning direction, display left-right direction). Here, it is preferable that pixels not belonging to the lighted line be caused to uniformly stop emitting light. With this, the contrast between the lighted line and the rest of the pixels improves, and the visibility of the lighted line can be enhanced.

In step S211, as a specific method for causing the display of the lighted line, the gate driver circuit 12 is caused to row-by-row sequentially supply HIGH level control voltages GS, GE, GR, and GI to the gate signal lines 121 to 124. Furthermore, the source driver circuit 13 is caused to supply, to only the source signal line 131 disposed to a certain pixel column, data voltages which are display gray level signals that cause the pixel column to uniformly emit light. Next, the source driver circuit 13 is caused to perform scanning by shifting the source signal line 131 that supplies the data voltage, sequentially on a column-by-column basis. The observer (operator) stops the column scanning of the lighted line at the point when the column-by-column sequentially shifting lighted line overlaps the pixel column having the line defect observed in advance.

Next, the display gray level of the lighted line is lowered (S213). Next, as a specific method for lowering the display gray level of the lighted line, the source driver circuit 13 is caused to change the data voltage being applied to the source signal line 131 disposed to the pixel column to which the defective pixel belongs and with which the lighted line overlaps, so that the display gray level of the lighted line falls. With this, the light-emission luminance of the organic EL elements 101 of the pixel column to which the defective pixel belongs falls, and thus the bright part range of the line defect can be reduced.

It should be noted that, in step S213, as a method for lowering the display gray level of the lighted line that overlaps with the line defect, the EL anode power supply voltage Vdd may be decreased instead of changing the data voltage. With this, the light-emission current flowing through the pixel column to which the defective pixel belongs becomes smaller and the light-emission luminance of the organic EL elements 101 falls, and thus the bright part range of the line defect can be reduced.

Next, the point of origin of the line defect is identified (5215). Specifically, the defective pixel which is the origin of the line defect is identified from the position, in the display unit 11, of the bright part range that was reduced in step S213.

According to the above-described line defect occurrence mechanism, in step S213, it can be determined that the defective pixel is included in an area that remains as a bright part despite uniformly lowering the display gray level of the line defect in the pixel column of the line defect.

Accordingly, after observing the line defect, it is possible to narrow down the bright part range and identify the defective pixel by uniformly lowering the display gray level of the lighted line, without having to observe the pixels included in the line defect in detail one by one. Therefore, the defective pixel identifying process can be simplified and shortened.

It should be noted that in the defective pixel identifying process, the pixels not belonging to the lighted line are caused to uniformly stop emitting light. However, depending on the luminance, the form of luminance change, etc. of the line defect that appears, the pixels not belonging to the lighted line may be caused to uniformly emit light at a predetermined luminance instead of being caused to uniformly stop emitting light.

(3-3. Defective Pixel Repairing Process)

Finally, the defective pixel is repaired (S30). Specifically, the state of impairment of the defective pixel identified in step S20 is observed, and the defective pixel is repaired when the defective pixel is determined to be repairable. On the other hand, when the defective pixel is determined to be irreparable, the defective pixel is not repaired, and the display panel including the defective pixel determined to be irreparable or the display panel in which the number of defective pixels determined to be irreparable exceeds a predetermined value is processed as a defective product.

It should be noted that solving the short-circuiting or open-circuiting in the defective area by irradiating the defective area with a laser or passing a pulse current of a predetermined value or greater through the defective area can be given as a method for repairing the defective pixel.

According to the above-described method for manufacturing a display panel, with respect to a line defect that emits light at a luminance that does not reflect uniform display gray level signals that are inputted: (1) a lighted line to which uniform display gray level signals have been inputted and the line defect are displayed overlapping each other by scanning the lighted line in the row direction or the column direction; (2) a bright part range or a dark part range is reduced by uniformly changing (i) the display gray level signals to be inputted to the pixel row or pixel column included in the lighted line displayed overlapping with the line defect or (ii) the drive power supply voltage in the lighted line; and (3) identifying a defective pixel which is the origin of the line defect, from the position of the reduced bright part range or dark part range, in the display unit. Accordingly, after observing the line defect, it is possible to narrow down the bright part range or the dark part range and identify the defective pixel by uniformly changing the display gray level of the lighted line, without having to precisely observe the pixels included in the line defect one by one. Therefore, the defective pixel identifying process can be simplified and shortened.

It should be noted that, although in the above-described manufacturing method, a defective pixel identifying method for the case where a line defect consisting of a pixel column or a pixel row appears is given as an example, the method for manufacturing a display pixel according to the present disclosure is not limited to such. For example, the defective pixel identifying process according to the foregoing embodiment can be applied even in the case where a line defect consisting of a combination of a pixel column and a pixel row or a line defect consisting of a plurality of pixel columns or a plurality of pixel rows appears in the display panel. In this case, a defective pixel can be identified by combining the respective steps included in step S20.

Furthermore, the display of the lighted line and the changing of the display gray level of the lighted line, though executed via the gate driver circuit 12 and the source driver circuit 13 included in the display panel 1 in the above-described manufacturing method, is not limited to such. For example, in the display panel forming process, the defective pixel identifying process in step S20 may be applied to the display panel prior to the mounting of the gate driver circuit 12 and the source driver circuit 13. In this case, the defective pixel identifying process in step S20 is executed by placing the display panel on an inspecting device having a built-in output circuit that outputs the respective control voltages and data voltages at a predetermined timing.

(4. Variation 1 of Display Panel Manufacturing Method)

In this variation, a manufacturing method is described in which step S20, which is the defective pixel identifying process described above, is executed a plurality of times to cope with the forms of change in the display panel manufacturing process.

Figure 6:
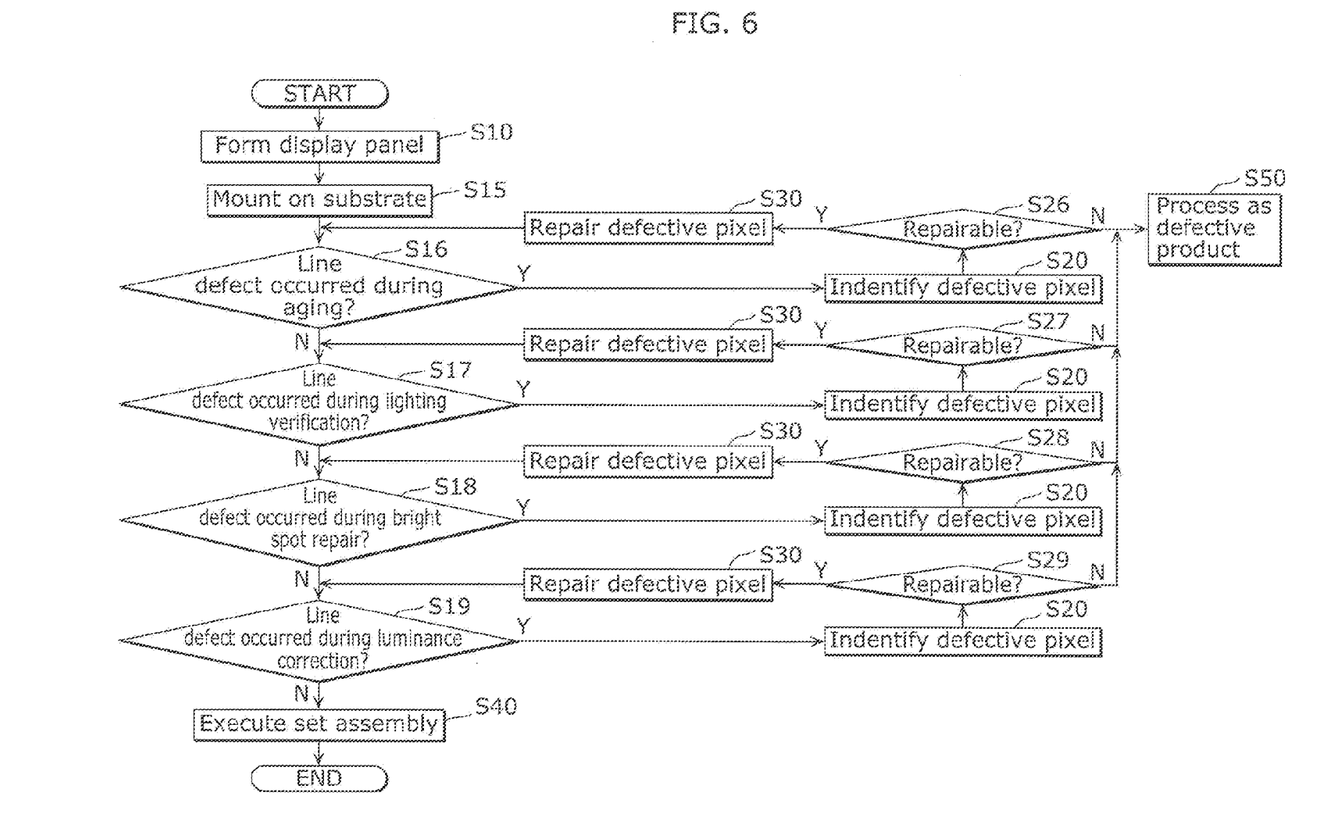
FIG. 6 is an operation flowchart describing a method for manufacturing a display panel according to Variation 1 of the embodiment.

FIG. 6 is an operation flowchart describing the method for manufacturing a display panel according to Variation 1 of the embodiment.

First, a display panel is formed on a display panel substrate (S10).

Next, circuit substrates of a gate driver circuit and a source driver circuit, etc. are mounted in surrounding portions of the display panel (S15).

Next, the display panel is aged, and then whether or not a line defect occurs in the displayed image is observed (S16).

When a line defect is confirmed in step S16 (Y in S16), the defective pixel identifying executed in the foregoing embodiment is executed (S20). When the identified defective pixel is determined to be repairable (Y in S26), the defective pixel is repaired (S30). When the identified defective pixel is determined to be irreparable (N in S26), the display panel is processed as a defective product (S50).

Next, when a line defect is not confirmed in step S16 (N in S16), display panel lighting verification is performed, and whether or not a line defect occurs in the lighting image is observed (S17).

When a line defect is confirmed in step S17 (Y in S17), the defective pixel identifying executed in the foregoing embodiment is executed (S20). When the identified defective pixel is determined to be repairable (Y in S27), the defective pixel is repaired (S30). When the identified defective pixel is determined to be irreparable (N in S27), the display panel is processed as a defective product (S50).

Next, when a line defect is not confirmed in step S17 (N in S17), display panel regular bright spot repair is performed, and then whether or not a line defect occurs in the displayed image is observed (S18).

When a line defect is confirmed in step S18 (Y in S18), the defective pixel identifying executed in the foregoing embodiment is executed (S20). When the identified defective pixel is determined to be repairable (Y in S28), the defective pixel is repaired (S30). When the identified defective pixel is determined to be irreparable (N in S28), the display panel is processed as a defective product (S50).

Next, when a line defect is not confirmed in step S18 (N in S18), display panel luminance correction is performed, and then whether or not a line defect occurs in the displayed image is observed (S19).

When a line defect is confirmed in step S19 (Y in S19), the defective pixel identifying executed in the foregoing embodiment is executed (S20). When the identified defective pixel is determined to be repairable (Y in S29), the defective pixel is repaired (S30). When the identified defective pixel is determined to be irreparable (N in S29), the display panel is processed as a defective product (S50).

Next, when a line defect is not confirmed in step S19 (N in S19), display panel set assembly is executed (S40)

According to the method for manufacturing a display device according to Variation 1, the defective pixel identifying process according to this embodiment is executed after each of processes in which a thermal load or an electrical load is applied, and thus defective pixel detection accuracy improves, and display panel manufacturing yield improves.

(5. Variation 2 of Display Panel Manufacturing Method)

In this variation, a method for more effectively reducing the bright part range or the dark part range in step S20, which is the defective pixel identifying process described above, will be described.

Figure 7:
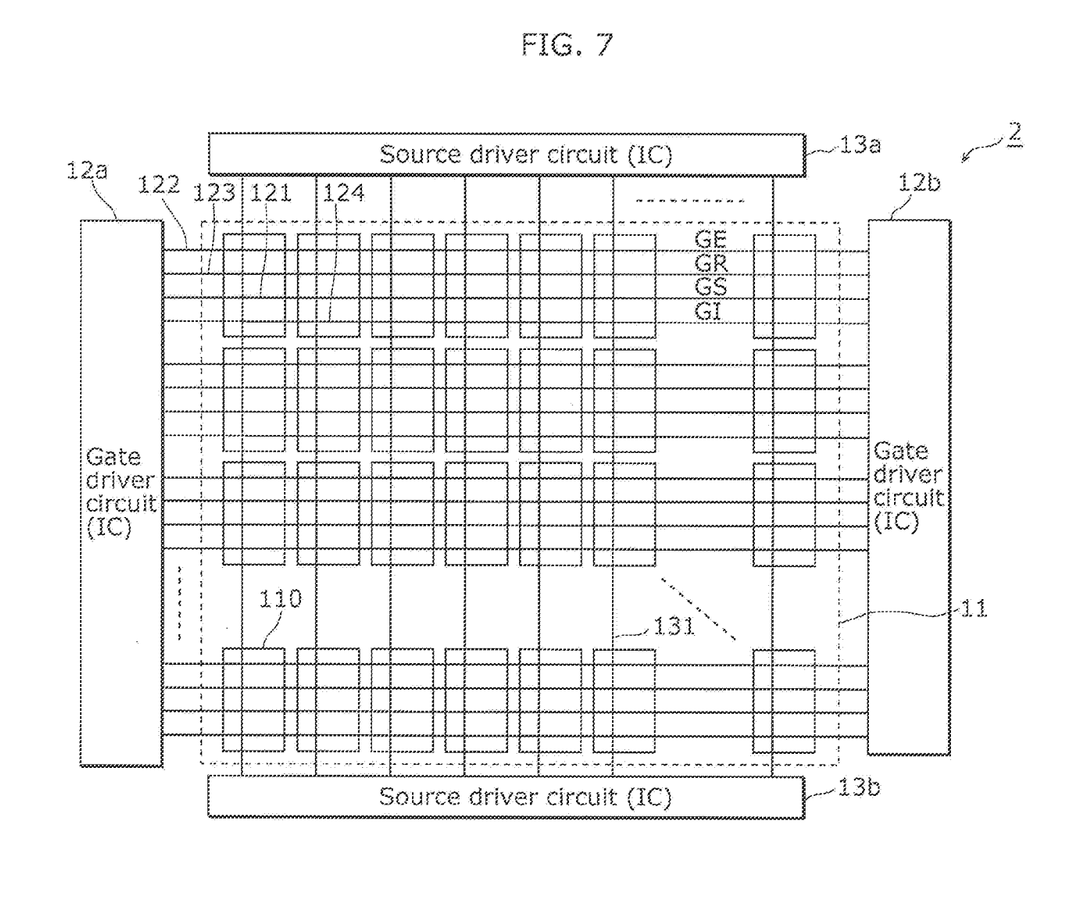
FIG. 7 is a schematic diagram illustrating a configuration of a display panel according to Variation 2 of the embodiment.

FIG. 7 is a schematic diagram illustrating a configuration of a display panel according to Variation 2 of the embodiment. As illustrated in FIG. 7, display panel 2 according to this variation includes the display unit 11, the gate signal lines 121 to 124, the source signal lines 131, gate driver circuits 12a and 12b, and source driver circuits 13a and 13b.

The gate signal lines 121 to 124 are connected to the gate driver circuits 12a and 12b, and to the pixels 110 belonging to each of the pixel rows.

The source signal lines 131 are connected to the source driver circuits 13a and 13b, and to the pixels 110 belonging to each of the pixel columns.

The gate driver circuits 12a and 12b are peripheral circuits of the display unit 11, and output control signals to the gate signal lines 121 to 124. The gate driver circuit 12a is disposed at the left end of the display unit 11. Furthermore, the gate driver circuit 12b is disposed at the right end of the display unit 11, at a position opposite the gate driver circuit 12a, with the pixels 110 arranged in rows and columns sandwiched therebetween. Here, the gate driver circuits 12a and 12b include switches for switching between conduction and non-conduction with the gate signal lines 121 to 124.

The source driver circuits 13a and 13b are peripheral circuits of the display unit 11, and output data voltages to the source signal lines 131. The source driver circuit 13a is disposed at the top end of the display unit 11. Furthermore, the source driver circuit 13b is disposed at the bottom end of the display unit 11, at a position opposite the source driver circuit 13a, with the pixels 110 arranged in rows and columns sandwiched therebetween. Here, the source driver circuits 13a and 13b include switches for switching between conduction and non-conduction with the source signal lines 131.

The method for manufacturing the display panel 2 having the above-described configuration, according to this variation will be described. Compared to the display panel 1 manufacturing method according to the embodiment, the display panel 2 manufacturing method according to this variation is different only in the display gray level changing processes (S203 and S213) out of the defective pixel identifying process (S20). Description of points identical to those in the display panel 1 manufacturing method according to the embodiment will be omitted and only the points of difference will be described below.

After a linear lighted line is displayed overlapping with the line defect in an image in which a line defect pattern A appears, the source driver circuit 13a or the source driver circuit 13b is placed in a non-conducting state with the source signal lines 131. For example, the source driver circuit 13a is placed in the non-conducting state when the dark part range of the lighted line overlapping with the line defect is observed in the lower region of the display unit 11, and the source driver circuit 13b is placed in the non-conducting state when the dark part range of the lighted line overlapping with the line defect is observed in the upper region of the display unit 11.

When the dark part range is observed in the lower region of the display unit 11, there is a high probability that the defective pixel is present at the lower part of the pixel column which is the line defect. Furthermore, when the dark part range is observed in the upper region of the display unit 11, there is a high probability that the defective pixel is present at the upper part of pixel column which is the line defect. By placing the source driver circuit 13a or 13b in the non-conducting state, the impedance of the source signal lines 131 can be changed, and thus the dark part range can be reduced.

After placing the source driver circuit 13a or 13b in the non-conducting state with the source signal lines 131, the display gray level of the lighted line is raised (S203).

With this, the dark part range of the line defect can be more effectively reduced.

It should be noted that even in an image in which the line defect pattern B appears, the dark part range of the line defect can be more effectively reduced by placing the source driver circuit 13a or 13b in the non-conducting state with the source signal lines 131 in the same manner as in the above-described manufacturing method in the case of an image in which the line defect pattern A appears.

[6. Advantageous Effects, etc.]

As described above, the method for manufacturing a display panel according to this embodiment includes the following, performed on a display panel having a line defect which either a pixel row or a pixel column that emits light at a luminance not reflecting display gray level signals: displaying a lighted line, which is a pixel row or a pixel column that emits light when uniform display gray level signals are inputted, and the line defect overlapping with each other, by displaying the lighted line on the display unit 11 and scanning the display unit 11 with the lighted line in the row direction or the column direction; reducing a bright part range or a dark part range in the line defect by uniformly changing, for all of the plurality of pixels included in the lighted line, (i) the uniform display gray level signals to be inputted to the lighted line displayed overlapping with the line defect or (ii) the drive power supply voltage that drives the drive elements; and identifying a defective pixel, which is the origin of the line defect, from the position of the reduced bright part range or dark part range, in the display unit 11.

Accordingly, after observing the line defect, it is possible to narrow down the bright part range or the dark part range and identify the defective pixel by uniformly changing the display gray level of the lighted line, without having to precisely observe the pixels included in the line defect one by one. Therefore, the defective pixel identifying process can be simplified and shortened.

It should be noted that in the displaying, the reducing, and the identifying, the plurality of pixels not included in the lighted line may be caused to stop emitting light.

Accordingly, the contrast between the lighted line and the rest of the pixels improves, and the visibility of the lighted line can be enhanced.

Furthermore, for example, in the reducing, the dark part range is reduced by raising a display gray level in the lighted line by (i) uniformly changing the uniform display gray level signals for the lighted line or (ii) uniformly increasing the drive power supply voltage for the lighted line, when the overlapping of the lighted line and the line defect in the displaying results in the lighted line having a display pattern that changes sequentially from bright to dark to bright, from one end of the lighted line to the other.

Accordingly, it is possible to narrow down the dark part range and identify the defective pixel by uniformly changing the display gray level of the lighted line.

Furthermore, for example, in the reducing, the bright part range is reduced by lowering a display gray level in the lighted line by one of (i) uniformly changing the uniform display gray level signals for the lighted line and (ii) uniformly decreasing the drive power supply voltage for the lighted line, when the overlapping of the lighted line and the line defect in the displaying results in the lighted line having a display pattern that changes sequentially from dark to bright to dark, from one end of the lighted line to the other.

Accordingly, it is possible to narrow down the bright part range and identify the defective pixel by uniformly changing the display gray level of the lighted line.

Furthermore, the method may further include repairing the defective pixel that is identified.

Accordingly, the defective pixel becomes a normal pixel, and thus the display panel manufacturing yield can be improved.

Furthermore, the method may further include aging the display panel and inspecting for presence of the defective pixel in the display unit after the aging, which are performed after the forming and before the displaying.

Accordingly, since a process of inspecting for the presence of a line defect and identifying a defective pixel is executed after a process in which a thermal load applied, defective pixel detection accuracy improves, and display panel manufacturing yield improves.

Furthermore, a first source driver circuit may be disposed at one end of the display unit and a second source driver circuit may be disposed at another end of the display unit which is opposite the one end, the first source driver circuit and the second source driver circuit supplying the display gray level signals to the plurality of pixels, and in the reducing, the bright part range or the dark part range on the line defect may be reduced by causing a non-conducting state between one of the first source driver circuit and the second source driver circuit and the plurality of pixels included in the lighted line, and, while supplying the uniform display gray level signals to all of the plurality of pixels included in the lighted line from the other of the first source driver circuit and the second source driver circuit, uniformly changing the uniform display gray level signals or the drive power supply voltage, for all of the plurality of pixels included in the lighted line.

Accordingly, the bright part range or the dark part range of the line defect can be more effectively reduced.

[Other Embodiments]

Although a method for manufacturing a display panel according to the embodiment has been described thus far, the method for manufacturing a display panel according to the present embodiment is not limited to the foregoing embodiment. Variations obtained by applying various modifications to the foregoing embodiment that can be conceived by a person of skill in the art which are within the scope of the essence of the present invention as well as display panels manufactured using the method for manufacturing a display panel according to the embodiment are included in the present invention.

Furthermore, although examples of the pixel circuit configuration included in the display panels 1 and 2 according to the present disclosure are given in the foregoing embodiment, the circuit configuration of pixels 110 is not limited to such circuit configurations. For example, although the foregoing embodiment gives, as an example, a configuration in which the switch 105, the drive transistor 102, and the organic EL element 101 are disposed, in this sequence, between the terminal to which the EL anode power supply voltage Vdd is supplied and the terminal to which the EL cathode power supply voltage Vss is supplied, these three elements may be disposed in a different sequence. Specifically, the display panels 1 and 2 according to this embodiment are not limited by the placement sequence of the drive transistor 102 and the organic EL element 101, even if the drive transistor was of the n-type or the p-type, as long as the drain and source of the drive transistor 102 and the anode and cathode of the organic EL element 101 are disposed on the current path between the EL anode power supply voltage Vdd and the EL cathode power supply voltage Vss.

Furthermore, description is carried out in the foregoing embodiment under the premise that the switches 103 to 106 are metal oxide semiconductor field effect transistors (MOSFETs) each having a gate, a source, and a drain, bipolar transistors having a base, a collector, and an emitter may be applied to these transistors. Even in such a case, the object of the present disclosure is achieved and the same advantageous effect is produced.

Furthermore, although the case of manufacturing a display panel using the organic EL elements 101 is described as an example in the method for manufacturing a display panel according to the foregoing embodiment, the method for manufacturing a display panel according to the foregoing embodiment may be applied to a method for manufacturing a display panel using light-emitting elements other than organic EL elements.

Figure 8:
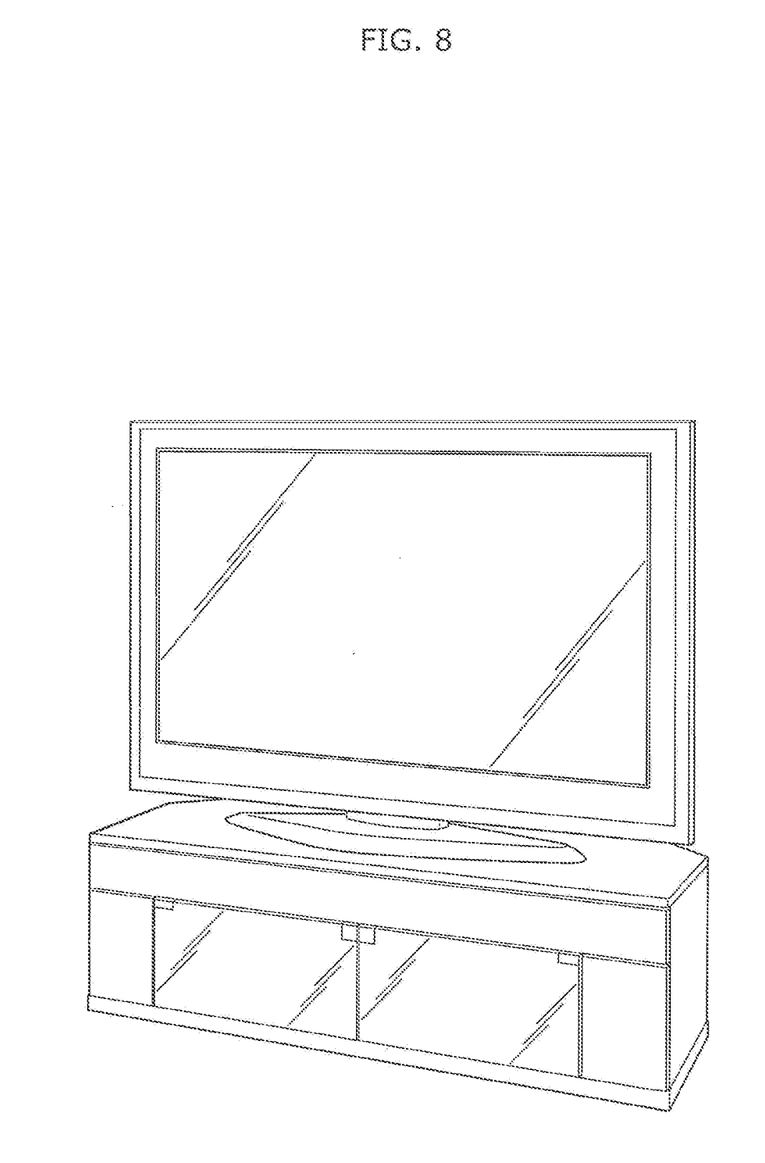
FIG. 8 is an external view of a thin flat-screen TV manufactured using the method for manufacturing a display panel according to the embodiment.

Furthermore, for example, the method of manufacturing a display panel according to the foregoing embodiment is applied to a thin flat-screen TV such as that illustrated in FIG. 8. By using the method of manufacturing a display panel according to the foregoing embodiment, a thin flat-screen TV including a display panel, the manufacturing process of which has been simplified and shortened.

INDUSTRIAL APPLICABILITY

The method of manufacturing a display panel according to the present disclosure, can be utilized, for example, as a method for manufacturing an organic EL display panel, etc.

The invention claimed is:

1. A method for manufacturing a display panel including a display unit in which a plurality of pixels, which emit light at a luminance reflecting display gray level signals that are inputted, are arranged in rows and columns, each of the plurality of pixels including a light-emitting element and a drive element that drives the light-emitting element, the method comprising the following, performed on the display panel having a line defect which is at least one of a pixel row and a pixel column that emits light at a luminance not reflecting the display gray level signals:

displaying a lighted line and the line defect overlapping each other by displaying the lighted line on the display unit and scanning the display unit with the lighted line in one of a row direction and a column direction, the lighted line being one of a pixel row and a pixel column that emits light when uniform display gray level signals are inputted;

reducing one of a bright part range and a dark part range in the line defect by uniformly changing, for all of the plurality of pixels included in the lighted line, one of (i) the uniform display gray level signals to be inputted to the lighted line displayed overlapping with the line defect and (ii) a drive power supply voltage that drives the drive element; and identifying a defective pixel which is an origin of the line defect, from a position, in the display unit, of the one of the bright part range and the dark part range that has been reduced.

2. The method for manufacturing a display panel according to claim 1, wherein, in the displaying, the reducing, and the identifying, the plurality of pixels not included in the lighted line are caused to stop emitting light.

3. The method for manufacturing a display panel according to claim 1, wherein, in the reducing, the dark part range is reduced by raising a display gray level in the lighted line by one of (i) uniformly changing the uniform display gray level signals for the lighted line and (ii) uniformly increasing the drive power supply voltage for the lighted line, when the overlapping of the lighted line and the line defect in the displaying results in the lighted line having a display pattern that changes sequentially from bright to dark to bright, from one end of the lighted line to the other.

4. The method for manufacturing a display panel according to claim 1, wherein, in the reducing, the bright part range is reduced by lowering a display gray level in the lighted line by one of (i) uniformly changing the uniform display gray level signals for the lighted line and (ii) uniformly decreasing the drive power supply voltage for the lighted line, when the overlapping of the lighted line and the line defect in the displaying results in the lighted line having a display pattern that changes sequentially from dark to bright to dark, from one end of the lighted line to the other.

5. The method for manufacturing a display panel according to claim 1, further comprising:

forming the plurality of pixels on a substrate before the displaying; and repairing the defective pixel after the identifying.

6. The method for manufacturing a display panel according to claim 5, further comprising aging the display panel and inspecting for presence of the defective pixel in the display unit after the aging, the aging and the inspecting being performed after the forming and before the displaying.

7. The method for manufacturing a display panel according to claim 1, wherein a first source driver circuit is disposed at one end of the display unit and a second source driver circuit is disposed at another end of the display unit which is opposite the one end, the first source driver circuit and the second source driver circuit supplying the display gray level signals to the plurality of pixels, and in the reducing, the one of the bright part range and the dark part range on the line defect is reduced by causing a non-conducting state between one of the first source driver circuit and the second source driver circuit and the plurality of pixels included in the lighted line, and, while supplying the uniform display gray level signals to all of the plurality of pixels included in the lighted line from the other of the first source driver circuit and the second source driver circuit, uniformly changing, for all of the plurality of pixels included in the lighted line, one of the uniform display gray level signals and the drive power supply voltage.

* * * * *